(12) United States Patent
Möller et al.

(10) Patent No.: US 8,741,113 B2
(45) Date of Patent: Jun. 3, 2014

(54) METHOD AND ELECTRODE FOR DEFINING AND REPLICATING STRUCTURES IN CONDUCTING MATERIALS

(75) Inventors: Patrik Möller, Sundbyberg (SE); Mikael Fredenberg, Stockholm (SE); Peter Wiwen-Nilsson, Stockholm (SE)

(73) Assignee: Centre de Recherche Public—Gabriel Lippmann, Luxembourg (LU)

( * ) Notice: Subject to any disclaimer, the term of this patent is extended or adjusted under 35 U.S.C. 154(b) by 131 days.

(21) Appl. No.: 13/417,808

(22) Filed: Mar. 12, 2012

(65) Prior Publication Data

US 2012/0228128 A1    Sep. 13, 2012

Related U.S. Application Data

(60) Continuation of application No. 12/801,219, filed on May 27, 2010, now abandoned, which is a division of application No. 10/734,223, filed as application No. PCT/SE02/01179 on Jun. 17, 2002, now Pat. No. 7,790,009.

(51) Int. Cl.
| | |
|---|---|
| *C25D 5/02* | (2006.01) |
| *C25D 7/12* | (2006.01) |
| *C25F 3/14* | (2006.01) |
| *H05K 3/00* | (2006.01) |
| *H05K 3/07* | (2006.01) |
| *H05K 3/20* | (2006.01) |

(52) U.S. Cl.
CPC ....... *H05K 3/205* (2013.01); *C25D 7/12* (2013.01); *C25F 3/14* (2013.01); *H05K 3/07* (2013.01); *C25D 5/02* (2013.01); *H05K 2203/0117* (2013.01); *H05K 3/00* (2013.01)
USPC ............... 204/290.01; 205/157; 205/640

(58) Field of Classification Search
USPC .................................................. 204/280–294
See application file for complete search history.

(56) References Cited

U.S. PATENT DOCUMENTS

| | | | | |
|---|---|---|---|---|
| 4,734,174 A | * | 3/1988 | Venis, Jr. ................ | 205/52 |
| 5,976,341 A | * | 11/1999 | Schumacher et al. ......... | 205/101 |
| 6,027,630 A | * | 2/2000 | Cohen ............................ | 205/135 |

* cited by examiner

*Primary Examiner* — James Lin
*Assistant Examiner* — Ho-Sung Chung
(74) *Attorney, Agent, or Firm* — James E. Walton; Daman R. Hickman

(57) ABSTRACT

The present invention concerns an electrochemical pattern replication method, ECPR, and a construction of a conductive electrode for production of applications involving micro and nano structures. An etching or plating pattern, which is defined by a conductive electrode, a master electrode, is replicated on an electrically conductive material, a substrate. The master electrode is put in close contact with the substrate and the etching/plating pattern is directly transferred onto the substrate by using a contact etching/plating process. The contact etching/plating process is performed in local etching/plating cells, that are formed in closed or open cavities between the master electrode and the substrate.

11 Claims, 5 Drawing Sheets

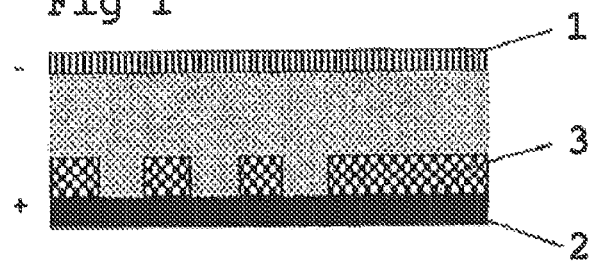
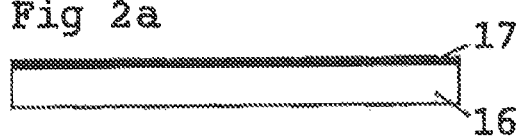
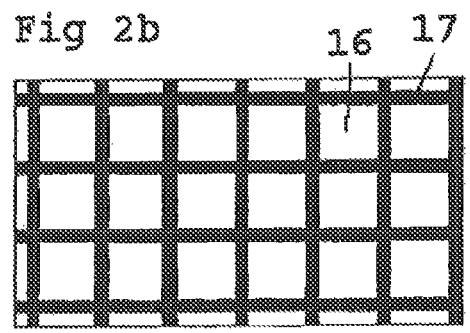
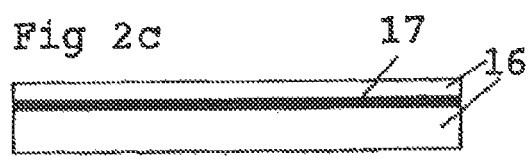
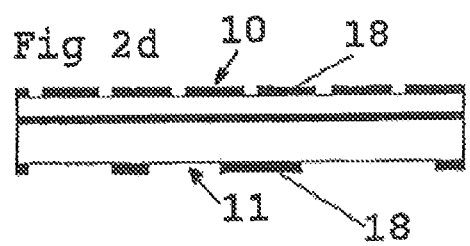
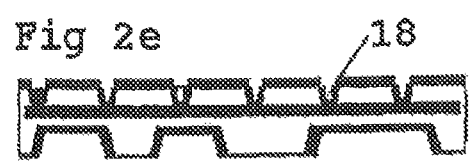

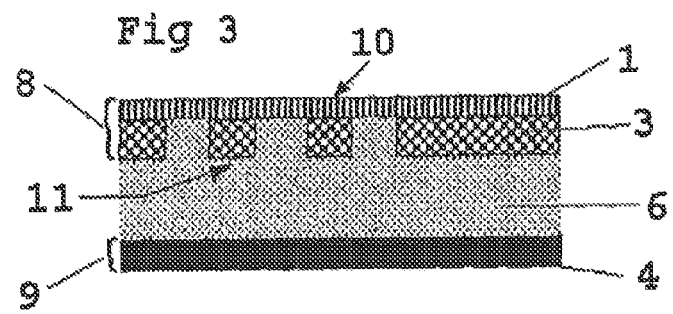
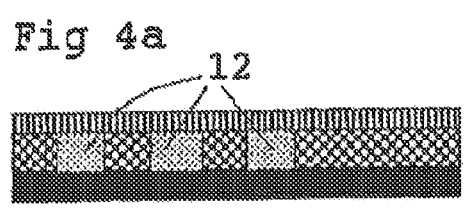
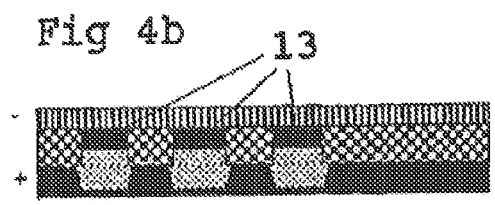
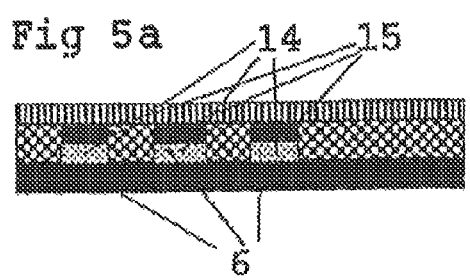
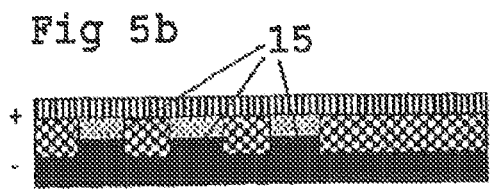

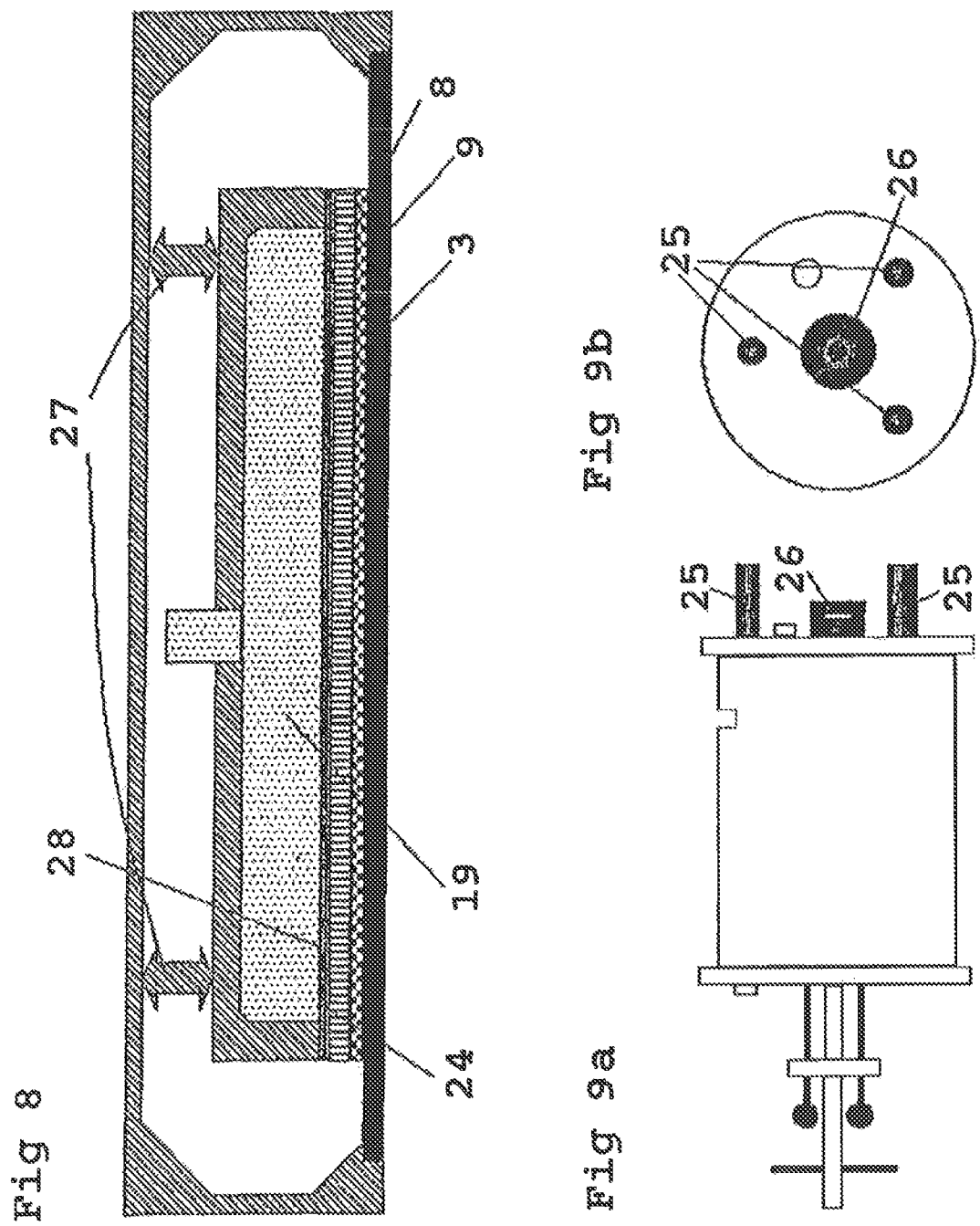

- Flexible conducting foil
- Insulating pattern layer
- Flexible elastomer layer
- Mechanical support layer
- Conducting electrode layer
- Conducting elastomer layer
- Intermediate layer

METHOD AND ELECTRODE FOR DEFINING AND REPLICATING STRUCTURES IN CONDUCTING MATERIALS

This is a continuation of application Ser. No. 12/801,219, filed May 27, 2010 now abandoned, which is a division of application Ser. No. 10/734,223, filed Dec. 15, 2003 (now U.S. Pat. No. 7,790,009), which is a §371 national stage application based on PCT Application No. PCT/SE02/01179, filed Jun. 17, 2002, which claims priority to Swedish Application No. SE 0102144, filed Jun. 15, 2001. All of these applications are hereby incorporated by reference in their entirety.

TECHNICAL FIELD

The present invention relates to a new etching or plating method for simplifying production of applications involving micro and nano structures by using a special electrode, according to the appended claims.

The present invention is closely related to electrochemical etching, plating, photolithography and pattern replication and is within the micro- and nanotechnic area.

The method is particularly useful for fabrication of PWB (printed wiring boards), PCB (printed circuit boards), MEMS (micro electro mechanical systems), sensors, flat panel display, magnetic and optical storage devices. Integrated circuits, different types of structures in conductive polymers, structures in semiconductors, structures in metals, and others are possible to produce using this method. Even 3D-structures in silicon, by using formation of porous silicon, are possible.

BACKGROUND OF THE INVENTION

The ever-increasing demand for smaller, faster and less expensive microelectronic and micro-electromechanical systems requires corresponding development of efficient and suitable manufacturing techniques.

Either additive or subtractive techniques are used in the fabrication of micro- and/or nano-structures on a surface. One general subtractive technique is etching and one general additive technique is plating.

The etching methods are usually divided into two sub-groups, dry- and wet etching. In general, dry etching is used for submicron structures and/or where straight sidewalls are important. Wet etching is used for large structures where some undercutting is acceptable or sometimes desirable. The wet etching techniques can be divided into chemical- and electrochemical etching.

The advantage of dry etching compared to wet etching is that anisotropic etched profiles can be generated in both crystalline and polycrystalline/amorphous material. Some of the disadvantages of dry etching are high equipment costs, lack of selectivity, problems with re-deposition on the sample, environmentally hazardous chemicals, surface damages on the etched sample and safety and disposal problems.

The advantage of wet etching is that it is a simple and inexpensive process. One of the disadvantages is that it does not involve any directional driving force and therefore the etching rate is the same in all directions, which results in an isotropic etchprofile. Some other disadvantages are that wet etching baths generally contain aggressive and toxic chemicals, which results in safety and disposal problems. In many wet etching processes waste treatment and disposal costs often surpass actual etching costs, and the same drawback applies for dry etching.

Detailed descriptions regarding the above mentioned etching processes are considered known by a man skilled in the art and will not be presented in this paper. Because of the close relationship between the etching method according to the present invention and the electrochemical etching some details regarding the later will be presented follows.

Electrochemical etching is a simple and inexpensive etching method, which makes it possible to achieve high etch rates and accurate process control. In electrochemical etching an external electrical potential is applied between an etched sample and a counter electrode, all immersed in a liquid etchant. An electrochemical cell with the working electrode, the sample, as anode and the counter electrode as cathode are formed, as shown in FIG. 1. An external potential is applied to drive the oxidation process at the working electrode. The corresponding reduction at the cathode is usually hydrogen gas formation. As electrolyte, and etchant, neutral salt solutions or very diluted mixtures of conventional etchant can be used. The applied potential, and the electric field from it give a directional etching in the vertical direction.

One problem the designers of electrochemical etching cells are facing is that, to reduce the resistive losses from charge transfer in the electrolyte, one wants a small electrode distance. A small distance, which makes just a tiny unevenness in the electrode, give rise to a relatively big $\Delta d$ that, gives a non-uniform current density distribution. The result is that some parts of the sample are over-etched while some parts are not etched to the desired depth. No mechanical support is possible to keep the electrode in position over the whole surface, since no contact between sample and counter electrode is allowed.

Another problem in electrochemical etching is non-uniform current density distribution arising from accumulated currents from non-etched areas, due to the fact that all parts of the counter electrode are in contact with the electrolyte, and not only the desired areas above the etched parts.

The second option, additive techniques, for pattern transfer is to add material in the structure formed on top of the substrate by the pattern-defining step. Electro-chemical deposition, for which the persons skilled in the art also use the term "electroplating", physical vapour deposition and chemical vapour deposition are examples of additive processes. It is known in the field that, by using electroplating, well defined patterns, vertical sidewalls and high aspect ratio structures can be fabricated. However, common industrial problems are associated with the known electroplating process, namely non uniform current density distribution resulting in a deposition rate depending on the pattern surrounding each structure that is plated. Furthermore, such differences in current density also result in different material composition when plating alloys, as well as differences in height of electroplated structures on a substrate. Up to now, these undesired uneven distributions typically have to be rectified using planarization methods in a subsequent process step.

When the purpose of etching is to provide a structure in the etching material by etching away selected parts thereof, the etching material which is not to be etched away is usually coated with an etching preventing layer, a so called mask or resist. The primary technique to define patterns to be etched is photolithography and a common etching preventing layer is a photo-resist. The photo-resist is exposed by electromagnetic radiation and developed to transfer the pattern where etching is wanted. Every sample that is etched has to be coated with resist, pre-baked, exposed, developed and hard-baked before the etching process can start.

Most of today's micro-devices are built up by a large number of functional layers and each layer has to be patterned and aligned in a photolithography process followed by a pattern transfer process. FIG. 6 shows a conventional etching process with the lithography process. The complicated nature of the pattern defining lithography process and the large number of lithography steps needed to fabricate a micro-device makes it to a major time and cost carrier in the total manufacturing chain.

From the European patent publication EP 1060299 it is known to use a method of making, by etching, depressions in selected portions of an etching surface by using an electrode with electrically conductive electrode portions in selected portions of an electrode surface, where the electrode portions is forming an electrode pattern which corresponds to the etching pattern. The method is different compared to the present invention by using electromagnetic radiation to dissolve a passivating layer, which is formed on the etching material. During etching the electrode is placed at a distance from the electrically conductive etching material, which also differs from the present invention. The electrodes according to BP 1060293 have to be transparent to electromagnetic radiation and they do not compensate for unevenness in the micro/nano areas.

WO 9845504 discloses a method for electroplating using an electroplating article, an anode and a substrate. The electroplating article is put in contact with the substrate. In one embodiment, the external anode is placed separated from the substrate and the electroplating article, all immersed in an electrolyte. According to the disclosure, a potential is applied over the external anode and the substrate, resulting in material transferred from the anode, through the porous carrier of the electroplating article and plated on the substrate in a pattern defined by the insulating mask of the electroplating article. The electrolyte volume between the electroplating article and the anode can be agitated to improve mass transfer of electroactive ions. However, the disclosed method struggles with the same problems and drawbacks as associated with conventional electroplating, namely non-uniform plating rates as a result of non-uniform current density distribution due to the anode having areas with a surface size differing from the surface size of corresponding cathode areas on the patterned substrate. Thus, differences in reaction rates in different cavities result in plated microstructures with different heights depending on the pattern surrounding each structure. The problem is usually solved by a subsequent planarization process step like lapping or CMP (Chemical Mechanical Polishing). When plating alloys, the method described in WO9845504 suffers from the same problems as conventional plating processes, namely differences in material composition because of non uniform current density distribution.

Furthermore, the mentioned embodiment disclosed in WO 9845504 requires an electroplating article fabricated with a porous material that is permeable for ions in the electrolyte, which gives rise to limitations in how small dimensions that can be defined, depending on the pore size of the material.

In a second embodiment disclosed in WO 9845504 it is mentioned an electroplating article that consists of a patterned mask placed onto an anode. The anode can be soluble or insoluble and can include an erodable layer. In the method using a soluble anode, the material is transferred from the anode material in the electroplating article, thus the electroplating acticle is eroded during use, but can be periodically redressed and reused. However, the problem of non uniform current density distribution also applies to this method, as the patterned mask still is placed as a separate layer onto the anode layer, i.e. the current density distribution is only at the beginning of a plating process uniform, whereas the contact surface of the electrolyte with the anode material increases differently in each local plating cell, depending on its size, as anode material is consumed. Moreover, the maximum aspect ratio, i.e. height/width ratio, of structures that can be plated is limited by the fact that the erosion of the anode material in the electroplating article undercuts the insulating pattern mask. Undercutting the mask layer during use is also associated with reliability problems, since the patterned mask layer will be completely undercut and disintegrated from the electroplating article if the electroplating process is not terminated in time. The problems described are inherently associated with the method because the soluble anodic material is transferred directly from the electroplating article itself, even in the case where the electroplating article consists of different layers of soluble and insoluble material.

SUMMARY OF THE INVENTION

One object of the present invention is to simplify production of applications involving micro and nano structures where an etching or plating pattern, which is defined by a conductive electrode, a master electrode, is replicated on an electrically conductive material, a substrate. Also, the master electrode should be possible to reuse many times to fabricate replicas according to the method. More specifically, an object of the invention is to avoid unnecessary process steps, such as the above mentioned planarization process steps, during said production of said structures, and to enable an accurately controlled electrochemical etching or plating process without limitations in maximum aspect ratio of deposited structures, variations in material composition of deposits and reliability problems in large scale production.

Generally, this object is met by a special contact electrochemical etching/plating method that is called the electrochemical pattern replication method. To simplify the description of the electrochemical pattern replication method according to the present invention it is stated as the "ECPR" method further in this description. This method is based on a structured electrode device, an electrochemical etching/plating method, and an apparatus to perform the process in, according to different aspects of the invention as defined by the appended independent patent claims.

The master electrode and the substrate are put in close contact, where local etching/plating cells are formed in the open or closed cavities between the master electrode and the substrate. A setup with an internal counter electrode surface inside each local electrochemical etch or plating cell, each defined by the walls of an insulating pattern layer, enables a uniform current density distribution independent of the pattern. To enable the internal counter electrode principle of ECPR in closed cavity electrochemical micro- and nano cells, predeposition of soluble anode material inside the cavities in the master electrode is being done prior to ECPR plating, and during ECPR etching electroplating of excess ions in the electrolyte created from substrate etching is being done. This results in uniform current density distribution of ECPR, independent of any pattern applied, solves the above-mentioned drawbacks associated with the prior art, namely different deposition speed depending on the pattern that is plated. Moreover ECPR eliminates the need for a subsequent planarization, since deposited structures already have the same height when being plated with the ECPR method. ECPR also solves the problems with limitations in maximum aspect ratio of structures deposited in each plating cycle and reliability problems associated with prior art. Furthermore, when plating alloys, ECPR also solves the above-mentioned problem of different material composition of different structures depending on the pattern surrounding each structure. Thus the object of the invention is met. Another advantage of the ECPR method, when used for etching, is that it enables a high and well controlled anisotropic etch profile, etch rate and surface finishing and uniformity, a possibility of accurate process control, minimised undercut, environmentally friendly process (since electrolytic or very diluted etchants is used) and low costs.

Another object is to design the master electrode, which is used in the ECPR method.

This object is met by integrating a counter electrode and pattern defining structures of an electrochemical etching/plating cell into one device, the master electrode. This master electrode will operate both as counter electrode and pattern master in the local etching/plating cell used in the ECPR method. The substrate, the sample on which the pattern is to be etched or plated on, operates as a working electrode in the etching/plating cell used in the ECPR method.

By using this master electrode combined with the ECPR method, several replicas can be produced in conducting materials by electrochemical material removal or addition inside each local electrochemical micro- or nano-cell defined by the master electrode.

Further objects and advantages of the present invention will be obvious to a person skilled in the art from reading the detailed description below of preferred embodiments.

BRIEF DESCRIPTION OF THE DRAWINGS

The invention will be described more closely below by way of examples and with reference to the enclosed drawings. In the drawings:

FIG. 1 is a sectional view of an etching cell used for conventional electrochemical etching.

FIGS. 2a to 2f are sectional views, which illustrate one of the fabrication processes of a master electrode, according to the present invention, based on open local electrochemical cells.

FIG. 3 is a sectional view of an etching/plating cell, according to the present invention.

FIG. 4a is a sectional view of an etching cell, where the master electrode and the substrate are compressed and closed local etching cells are formed, according to the present invention.

FIG. 4b is a sectional view of an etch cell, where the pattern has been etched on the substrate, according to the present invention.

FIG. 5a is a sectional view of a plating cell, where the master electrode and substrate are compressed and closed local plating cells are formed, according to the present invention.

FIG. 5b is a sectional view of a plating cell, where the pattern is replicated on the substrate, according to the present invention.

FIG. 8 is a sectional view of a principal apparatus used for single sided etching/plating with the ECPR method, according to the present invention.

FIG. 9a is a side view of an example of another apparatus used for etching/plating with the ECPR method, according to the present invention.

FIG. 9b is an end view of the same apparatus that is shown in FIG. 9a.

DETAILED DESCRIPTION OF PREFERRED EMBODIMENTS

Figure 6:
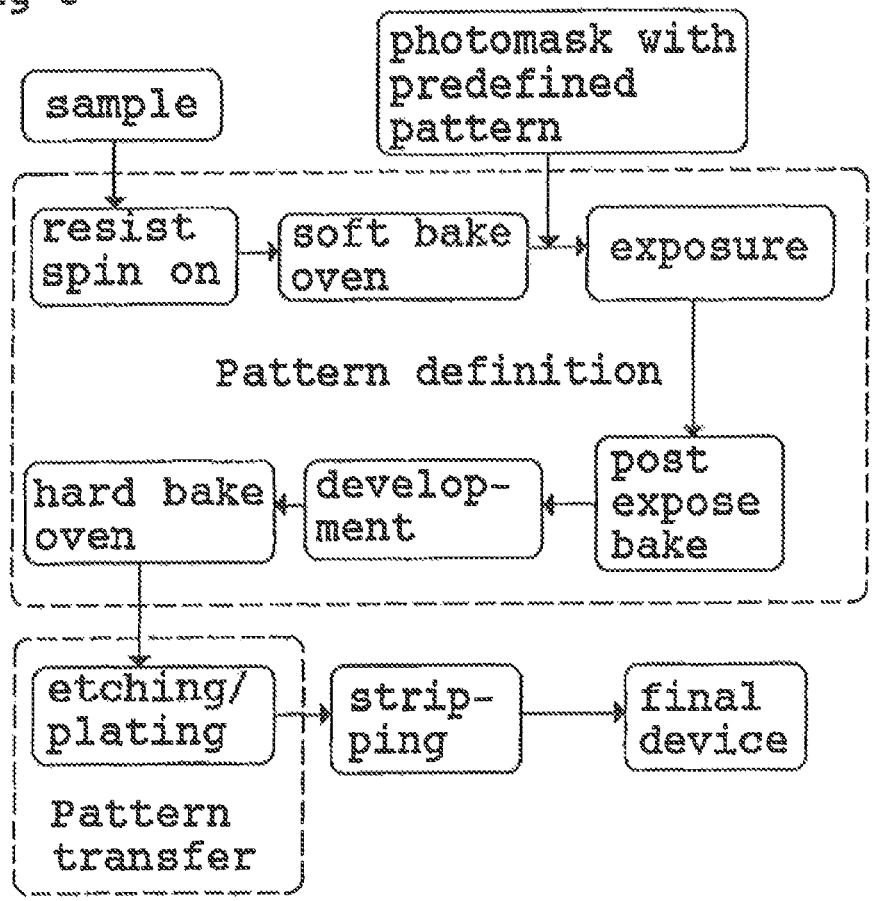
FIG. 6 is a flowsheet of a microfabrication process, with a photolithography process.
Figure 7:
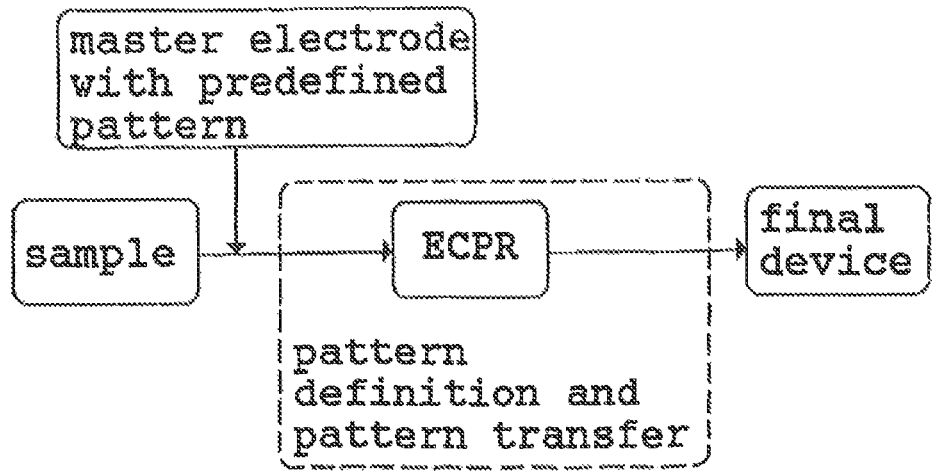
FIG. 7 is a flowsheet of the ECPR process, according to the present invention.
Figure 10A:
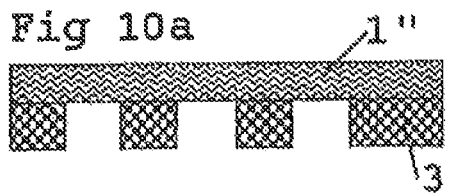
FIGS. 10a to 10h are sectional views of different exemplary combinations of designs and materials of a master electrode, according to the present invention.
Figure 10B:
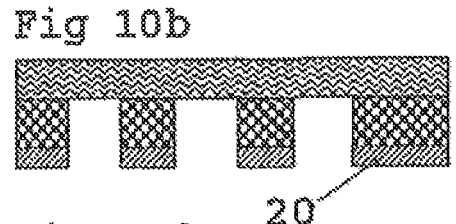
Figure 10C:
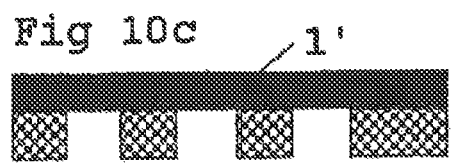
Figure 10D:
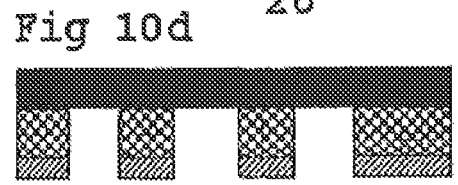
Figure 10E:
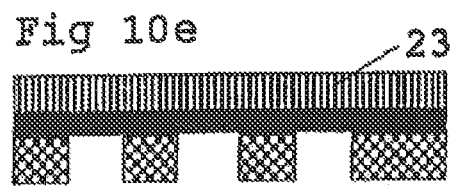
Figure 10F:
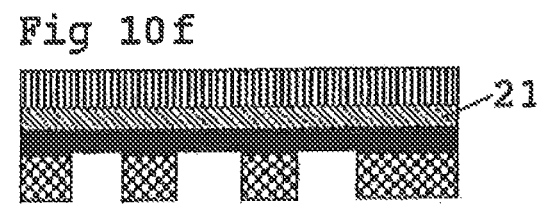
Figure 10G:
Figure 10H:
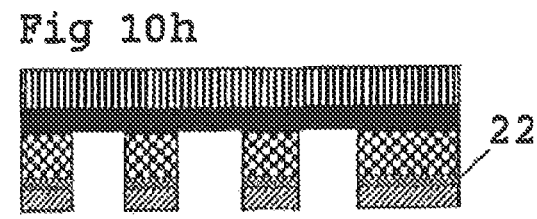

A master electrode 8 of the present invention operates both as a counter electrode 1 and a pattern defining master, and a substrate B operates as a working electrode 2 in an etching/plating cell, which is shown in FIG. 3, used in the ECPR process, according to the present invention.

Further on in the description an exemplary etching or plating process is mentioned, but it should be noted that it is, obvious to a man skill in the art that it also concerns and applies correspondingly to the respective plating or etching process.

Master Electrode

The purpose of the master electrode 8 is to provide a well defined predeposited anode material electrical connection to all local plating cells 14 formed when compressing the master electrode 8 and the substrate $ and, at the same time, to provide electrical insulation to the areas where electrochemical action is undesired, i.e. at the contact areas between an insulating pattern layer 3 and the substrate 3. To enable a well-defined pattern transfer, even for relatively rough substrate surfaces, a conformable behaviour is needed, both globally over the entire substrate surface and locally at each insulating structure of the pattern layer in contact with the substrate surface. This is satisfied by a flexible, behaviour of the entire master electrode globally on the macro scale and a compressible elastomer layer 20, 21 within the master electrode construction on the local micro scale.

The insulating pattern layer 3 is fabricated by using an electrically insulating material that is chemically inert in the electrolytes that are used, enables high aspect ratio structures and is easily patterned using i.e. UV, X-ray, electron beam, laser or etching/plating combined with an insulating process. Examples of insulating materials, which may be used are polyimide, SU-8, SC 100, MRL 6000, ED-resist and Teflon materials. In another embodiment the insulating portions are made by anodising a conducting material, e.g. a metal.

The counter electrode 1 comprises a conducting electrode layer 1'. Alternatively, the conducting electrode layer may also comprise a flexible conducting foil 1", a solid metal sheet or a thin conducting layer on a mechanical support layer 23. When the conducting electrode layers 1', 1" are deposited on a mechanical support layer 23 or an elastomer layer 21 with a very high surface uniformity, the two features planarity and high surface uniformity are combined. Crucial material characteristics for the conducting electrode layer 1', 1" are high conductivity, chemically inertness in the electrolytes used, good seed layers for electrochemical material deposition and suitable methods for depositing or in other ways incorporating the layer into the integrated master electrode construction. A non-limiting list of examples of conducting electrode layer 1', 1" materials used comprises stainless steel, platinum, palladium, titanium, gold, graphite, chromium, aluminium and nickel.

According to an embodiment, the master electrode is manufactured by using a conventional microfabrication method, which is illustrated in FIG. 6. The different embodiments of master electrodes used for ECPR processing are described in FIGS. 10a-10h. All different electrode layer 1', 1" embodiments may be combined with all different combinations of insulating pattern layer 3, flexible elastomer layer 20, 21, mechanical support layer 23 and intermediate metal layers 22. All these configurations may be used for both an open cavity concept and a closed cavity concept. These concepts will be explained further on in the present document.

Master electrodes for the open cavity configuration may foe fabricated using the method described below.

The master electrode used for open cavity configuration is fabricated in two major steps. In the first step the counter electrode layer 1 is shaped and prepared to meet the different requirements stipulated as crucial for successful ECPR processing. After meeting these requirements an insulating pattern layer 3 is deposited and patterned on the counter electrode layer 1.

In the preferred embodiment titanium has been chosen as a master electrode material since it is inert in the electrolytes being used. Furthermore, anodising can form a dense insulating outer layer of $TiO_2$ at the contact areas. It is possible to use other materials as well, which has been mentioned above.

Since the master electrode 8 is in contact with the working electrode 2, some parts of the master electrode have to be made of an insulating material, an insulating pattern layer 3 on the contact side, the master side 11. The insulating pattern layer 3 prevents the areas where etching is undesired from etchant contact.

All the manufacturing steps of the master electrode 8 may be carried out with conventional microfabrication processes, known from the prior art, wherein characteristic steps are shown in FIG. 6.

Accordingly, the master electrode 8 will be fabricated out of two titanium foil layers 16, as stated before, which is shown in FIGS. 2a to 2e, with a sacrificial photo-resist layer 17 in between, to form gas/electrolyte transport channels. An example of how the fabrication of this master electrode may be performed is as follows:

1. The starting material, the sample in FIG. 6, is a 4 μm Ti-foil layer 16. A 1 μm sacrificial photo-resist layer 17 is electrochemical deposited, as shown in FIG. 2a. To form fluidic 5 channels, the resist forms square with 4 μm width, separated with 1 μm resist lines, as shown in FIG. 2b. A second Ti-foil layer 16, 3 μm, is deposited on top of the sacrificial resist layer 17, as shown in FIG. 2c.
2. Both long sides of the "sandwich", which are shown in FIG. 2c, are coated with ED-resist 18, as shown in FIG. 2d. The master side 11 is patterned with desired master pattern and the outer side 10 is patterned with 1 μm holes, according to the pattern definition process shown in FIG. 6.
3. Double-sided electrochemical etching is performed, according to the pattern transferring process shown in FIG. 6. The outer side 10 is etched to the sacrificial resist layer and the master-side 11 is etched to a depth of 3 μm, saving 1 μm for gas traps. A new layer of ED resist is deposited. The contact areas are exposed and developed. The contact areas are anodised and isolating $TiO_2$ is formed, as shown in FIG. 2e.
4. The photo-resist is stripped thoroughly in alkaline solution to dissolve outer layers and sacrificial layer, as shown in FIG. 2f.

All fabrication steps for the outer side 10 of the master electrode 8 are standardised and do not depend on what kind of master structure that is used. Universal standard masks may be used. Only the masks for the master-side 11 have to be selected for every specific master structure. The master electrode is ready to be mounted in an etching cell.

The fabrication of a closed cavity master electrode may be performed in the same way as the above described fabrication process of the open cavity master electrode except for the sacrificial resist layer. Several combinations of material are shown in FIG. 10a to 10h.

A very important part of the ECPR process is to use a suitable insulating layer. One of many benefits of the process is that it would no longer be needed to apply a resist on each sample but instead the resist would be out on a reusable master. For this to be a benefit it of course requires that the resist withstand several process cycles. Besides that, the resist also governs how small structures that can be made, what volume electrolyte to sample depth ratio one can have and also, how easy it is to keep all structures in contact with the sample. Electro-deposited photo-resist, ED resist, which is often used for lithography processes, is suitable for these etching processes as it can be deposited with very precise thickness control.

The embodiments of the master electrode according to the present invention are in no way limited to the examplary constructions and design shown neither in FIGS. 2a-2i, or 10a-10h, nor to the materials listed as suitable in the description above.

Substrate

Any electrically conductive material durable to electrochemical stresses, e.g. copper, may be used as substrate material.

Electrolyte

The electrolyte composition is crucial in controlling an electrochemical process and its different features. Conductivity, ion mobility, ionic atmosphere, relaxation, migration, diffusion and transport numbers are important concepts.

When an electrolytic etchant is used there is no or less chemical etching and the negative influences will be negligible on the replicated structures. The existence of chemical etching depends on if there is a chemical oxidation agent present in the electrolyte solution.

One important issue that the electrolyte has to take care of is to optimise a mass-transport of electro-active ions in Ideal electrochemical cells, which has to occur to achieve an optimised ECPR-process. The optimisation of the electrolyte to cause an optimised mass-transport is described below, after the description of the ECPR-process.

Reducing components, e.g. metal ions, could be added to the electrolyte solution if one wants to prevent deposition of substrate material and to cause an etch process to stop in a natural way. When reducing components are added the reduction process will take place in the electrolyte and there will be a natural ending of the etching process when there is a balance between the reduction components and the deposited components.

ECPR Process

The substrate 9 and the master electrode 8 are put together in close contact and form an etching cell, as shown in FIG. 4a.

They will be mounted in an apparatus where the ECPR process will take place. This apparatus will be described in more detail below. One of its main issues is to keep the electrodes in exact place once they are put in contact and to supply them with a conformable contact.

The insulating pattern layer 3 defines the distance between the counter electrode 1 part of the master electrode and the substrate 9. Thanks to the fact that the distance is short and precise all over the surface it solves the problems with non-uniform current density distribution and non-etched areas. It also minimises the resistive losses from charge transfer in the electrolyte.

The structure is replicated on the substrate 9 because the field and motion of the ions in the etching/plating solution is controlled in vertical direction by the master electrode 8.

Since the master electrode 8 and the substrate 9 are in close contact, closed or open cavities, local etching cells 12, are provided between the electrode surfaces. If the cavities are open or closed depends on how master electrode 8, that is used, is constructed, with or without a sacrificial resist layer 17. The cavities are considered to be closed further in the document. These, very small and well-controlled, spaces between the electrodes provide an effective etching with high precision. Every local etching cell 12 has a surface on the master electrode 8, which corresponds to a surface on the substrate 9 which is to be etched away and thereby avoiding the problems with fluctuating current density distribution in the vicinity of large insulating areas with adjacent small structures.

According to the invention, an ECPR method for etching selected parts of a surface defined by the master electrode, which was described above, has thus been provided.

FIGS. 3, 4a and 4b show the different steps in the ECPR etching process, according to the present invention.

The steps are as follows:
1. The master electrode 8 and the substrate 9, are immersed into an electrolyte solution 6, which will be described later, as shown in FIG. 3.
2. They are compressed and an etching cell with local etching cells 12, filled with electrolyte solution 6, is formed. This is shown in FIG. 4a. It is also possible to apply the electrolyte solution as a very thin layer of liquid on one of the surfaces before the electrodes are compressed, e.g. by dipping the surfaces into the electrolyte solution before the compress procedure, or to supply the electrolyte solution to the etching cell, after compressing the electrodes, through the layer on the outer side 10 in the master electrode 8.
3. An external pulsed voltage with or without additional ultrasound is applied over the etching cell, where the substrate 9 becomes the anode and the master electrode 8 becomes the cathode.
4. FIG. 4b shows how the pattern 3, which is defined by the master electrode 8, is replicated on the substrate 9. The material that has been etched away has been deposited on the master electrode 8, a deposit material 13, all inside 20 each local electrochemical cell.
5. Since some of the substrate material that is etched from the anode is deposited in the structure on the master electrode 8 it will eventually be filled with substrate material, deposit material 13, and therefore it is essential to have an easy way to clean the master electrode. After a number of etching cycles, a cleaning process is normally performed. The deposit material 13 is etched away from the 30 master electrode 8.

FIGS. 5a and 5b shows the different steps in the ECPR plating process, according to the present invention. The plating process is almost the same as the etching process except the following steps;
1. Before the electrodes 8, 9 are compressed and immersed into electrolyte solution, plating material 15 has been deposited on the master electrode 8 in the cavities, which are defined by the insulating pattern layer 3. When a certain height of the plating structure has been reached will the space, formed by the local plating cells 14 between the master electrode 8 and the substrate 9, be filled with electrolyte solution 6, as shown in FIG. 5a.
2. The pattern, which is defined by the master electrode 8, replicates on the substrate 9 when the external pulsed voltage is applied over the plating cell 14, where the master electrode 8 becomes the anode and the substrate 9 becomes the cathode. Consequently, the plating material IS, which was deposited on the master electrode 8, has been plated on the substrate 8, as shown in FIG. 5b. Since all plating material, which can be plated on the substrate, has, from the beginning, been deposited on the master structure, the amount of plating material, which is plated on the substrate, is controlled with high precision.

Major advantages using the ECPR process are uniform current density distribution in each local electrochemical cell and globally over the entire substrate independent of cell size, shape and neighbouring cells according to the pattern. As mentioned in the above summary of the invention, this solves the problems of non-uniform height of plated structures, the problem with non-uniform material composition when plating alloys, and eliminates the need for a subsequent planarization process, it also enables deposition of structures with high aspect ratio, i.e. height/width ratio, and a highly reliable process for large scale production.

An optimised mass-transport of electro-active ions in these cells has to occur to achieve an optimised ECPR-process. The mass-transfer, with transport of material from one location in solution to another location, arises from differences in electrical or chemical potential at two locations, or from movement of a volume element of solution. There are three modes of mass-transfer, migration, diffusion and convection. For thin-layer electrochemical cells, as is in this case, there is a much larger A/V ratio than for regular macroscopic cells. The high A/V ratio implies large frictional forces per unit volume, making all electrolyte volumes to stagnant layers. This means no forced convective mass transfer occurs, except when using ultrasound, leaving only the diffusion and migration mechanisms to exert the material transport. This concerns the closed cavity master electrode. In the open cavity master electrode there is a micro-convection because of the sacrificial resist layer, where the channels in the layer allow a micro-convection mechanism.

Following actions is made to optimise the mass-transport:
1. Electrolyte Solution The parameters that were adjusted in the solution were the pH-value and the electro-active species/supporting electrolyte ratio.

In one embodiment acid copper electrolyte was used as electrolyte solution. The pH-value was changed by adding either $H_2SO_4$ or diluted NaOH. Several experiments were made to establish which pH-value was the best. It was settled, in this embodiment, that a pH-value of 2 to 5 was satisfying.

No or less supporting electrolyte in combination with a higher concentration of electro-active species, compared to standard electrolytes, also improves the mass-transport. A concentration of electro-active species of 10 to 1200 mM is preferred.

The ECPR process involves both electrochemical etching and electro-deposition at the same time. Electro-deposition is the reversed electrochemical etching process, where ions from the electrolyte is reduced and deposited on the cathode. The same conditions apply and the same parameters control the two processes. With conventional electroplating processes there is a tendency to obtain a higher deposition rate at the top of a cavity, than at the bottom, when the high aspect ration structures are to be filled. This might result in voids, affecting the mechanical and electrical properties of the microstructure in a negative way. The geometry of the local electrochemical cell and the use of additives are solutions to enable "bottom-up-filling" without any voids. Additives are added to give the electrolyte a sufficiently controlled electro-deposition. Additives are often used in plating processes to make the plating even. It contains several active components but predominantly it prevents the forming of pillars by being attracted to and covered high current density areas as soon as the pillars start forming. This turned out to be a key to the problem and as soon as it was used a clean and solid substrate material was formed on the cathode. Several commercial systems have been tested with satisfactory results. Coveted additives are wetting agents, which lowers the surface tension, accelerators, which are molecules that locally increases current density where they absorb, suppressors, which are polymers which tend to form current-suppressing film on the entire substrate surface (could sometimes use chloride as co-suppressor) and levelers, which are current suppressing molecules with mass transfer dependent distribution.

To avoid a far too high concentration of electro-active species at the anode, which give a local saturated compound and deposition of solid salt, the counter-ions are exchanged to ones, which provide a higher solubility product. Further, a sequestering agent could be added, e.g. EDTA, to dissolve more metal ions without causing any further precipitation, 2. Voltage Pulsed-voltage was chosen because it enhances mass transfer and disturbs the formation of blocking layers at the electrode-solution interface. Tests were made to determine what kind of frequencies, duty cycles and potentials to use. Both periodic pulse reverse voltage (PPR) and complex waveforms have been used with success. Frequencies of 2 to 20 kHz have been tested with satisfactory results but also higher frequencies are possible. In the described embodiment the frequency of 5 kHz is preferred. The potential is from 0 to 10 V.

3. Ultrasound

Ultrasound may be used together with pulsed voltage to enhance the mass-transport by micro-convection.

A machine solution to exert the actions described in this document is a crucial part of the invention. The purpose of the machine is to compress the two electrode surfaces, the master electrode and the substrate, to create the micro/nano cavities where the local electrochemical cells are formed. To enable conformable surfaces in both micro/nano- and macro scale, flexible layers in the machine, for macro scale conformable behaviour and plane parallelism, are combined with flexible layers within the master electrode, which enables micro- and nano scale conformable behaviour. In this way both bent and dented substrates with a rather high surface roughness can be used for ECPR processing.

Before compressing the electrodes 8, 9 to create the local etching cells 12, all gas has to be evacuated from the solution and from the solid/liquid interface between the master electrode 8/electrolyte 6 and electrolyte 6/the substrate 9. In one embodiment this is done using a vacuum system and in another using ultrasound. The two gas bubble elimination methods can also be combined. Evacuated gas and electrolyte has been taken care of by a buffer volume connected between a reaction chamber and a vacuum system.

To enable the ECPR process, both master electrode 8 and substrate 9 have to be electrically contacted in the same machine solution. This has been done with outer side 10 contacting on the master electrode 8 and front side, the contacting side, contacting on the substrate 9. The invention is however in no way depending on this configuration.

There are two main machine embodiments to perform the desired actions for ECPR processing.

The first embodiment, which is shown in FIG. 8, is based on a membrane solution where a pressurised membrane 24 is expanded against the master electrode 8 or the substrate 9. The medium 19 inside the pressure volume can be both gas and liquid. Gas bubbles are eliminated by a combination of ultrasound and vacuum, or just using ultrasound. In this embodiment electrical contact to the master electrode 8 is provided from the outer side 10, i.e. from the membrane 24 and contact to the substrate 9 from the front side. Plane parallelism is ensured by the nature of the expanding membrane, applying an even pressure in a conformable way. Both flexible and rigid master electrodes and substrates can be used in this embodiment.

The second embodiment is based on a cylinder, which is shown in FIG. 9, containing a moveable piston, not shown in the figure. The entire system is confined. Pressure is applied to compress the two electrodes 8, 9 pneumatically using a combination of vacuum and overpressure or hydraulically using a hydraulic piston or mechanically using a screw. Gas bubbles are eliminated by a combination of ultrasound and vacuum, in this embodiment electrical contact 26 to the master electrode is provided from the outer side 10 and contact to the substrate 25 from the front side using conducting movable rods. Plane parallelism is ensured by two flexible elastomer layers between the sample and the piston, one being more compressible than the other is. These elastomer layers can also be placed behind the master electrode 8, i.e. between master electrode and cylinder wall. Both flexible and rigid master electrodes and substrates can be used in this embodiment, The invention is in no way limited to the embodiments illustrated and described above, and several modifications are feasible within the scope of protection as defined in the appended claims.

The invention claimed is:

1. An electrode suitable for an etching or plating process, comprising a counter electrode and a pattern defining structure of an electro chemical etching or plating cell are integrated into a master electrode, wherein the counter electrode is a conducting electrode layer or a flexible conducting foil, and the pattern defining structure is an insulating pattern layer being applied on said counter electrode;

wherein the counter electrode is applied on a mechanical support layer; and wherein a conductive elastomer layer is applied between the counter electrode and the mechanical support layer.

2. The electrode according to claim 1, wherein the counter electrode is inert.

3. The electrode according to claim 1, wherein a flexible elastomer layer is applied on the insulating pattern layer.

4. The electrode according to claim 3, wherein an intermediate metal layer is applied between the insulating pattern layer and the flexible elastomer layer.

5. The electrode according to claim 1, wherein the flexible conducting foil is made of titanium.

6. The electrode according to claim 5, wherein the master electrode comprises two counter electrodes with a sacrificial photo-resist layer applied in between; and wherein contact parts of the master electrode and structures of the insulating pattern layer are electrochemically anodised to form an isolating layer.

7. The electrode according to claim 6, further comprising means for creating conformable contact between the master electrode and a substrate;

wherein said means are one or more elastomer layers in the master electrode construction.

8. The electrode according to claim 7, wherein there are conducting means for electrical connection to the master electrode on an outer side and electrical connection to the substrate on a contact side; and wherein said conducting means for electrical connections is a conducting piece applied on the outer side of the master electrode.

9. The electrode according to claim 7, wherein said means are combined with a conformable membrane.

10. The electrode according to claim 9, wherein the master electrode is fixed in the apparatus by a pressure against a conducting piece, said pressure exerted by the conformable membrane.

11. The electrode according to claim 10, wherein said pressure when applied with the conformable membrane is combined with a reservoir containing gas or liquid.

\* \* \* \* \*